United States Patent
Lu et al.

(10) Patent No.: US 7,928,756 B1
(45) Date of Patent: Apr. 19, 2011

(54) METHOD AND SYSTEM FOR REDUCING I/O NOISE AND POWER

(75) Inventors: Weiye Lu, Sunnyvale, CA (US); Elroy M. Lucero, San Jose, CA (US); Thomas Tse, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/074,176

(22) Filed: Feb. 29, 2008

(51) Int. Cl.
  *H03K 17/16* (2006.01)
  *H03K 19/003* (2006.01)

(52) U.S. Cl. .............. 326/27; 326/86; 326/87; 327/109; 327/112

(58) Field of Classification Search .................... 326/21, 326/26–27, 82–83, 86–87; 327/108–109, 327/112
See application file for complete search history.

(56) References Cited

U.S. PATENT DOCUMENTS

| | | | | |
|---|---|---|---|---|
| 5,218,239 A * | 6/1993 | Boomer | ........................... | 326/27 |
| 5,426,376 A * | 6/1995 | Wong et al. | ..................... | 326/27 |
| 5,438,277 A * | 8/1995 | Sharpe-Geisler | .............. | 326/27 |
| 5,534,791 A * | 7/1996 | Mattos et al. | .................... | 326/27 |
| 5,877,647 A * | 3/1999 | Vajapey et al. | ................ | 327/391 |
| 6,160,416 A * | 12/2000 | Adduci et al. | .................. | 326/21 |
| 6,265,892 B1 * | 7/2001 | Jou et al. | ......................... | 326/27 |
| 6,313,672 B1 * | 11/2001 | Ajit et al. | ....................... | 327/112 |
| 6,320,432 B1 * | 11/2001 | Nagao | ............................. | 327/108 |
| 6,348,814 B1 * | 2/2002 | Peterson | ......................... | 326/58 |
| 6,686,763 B1 * | 2/2004 | Yen | ................................. | 326/30 |
| 2002/0135405 A1 * | 9/2002 | Chen | .............................. | 327/112 |
| 2006/0119326 A1 * | 6/2006 | Jiang | .............................. | 323/222 |

* cited by examiner

*Primary Examiner* — Jason M Crawford

(74) *Attorney, Agent, or Firm* — Jurgen K. Vollrath; Vollrath & Associates

(57) ABSTRACT

In an I/O circuit, noise reduction and power savings are achieved by providing feedback from the output of the I/O driver to control the current through the pre-driver and thereby the current through the driver transistors after a non-zero time delay following a low to high or high to low data signal change.

12 Claims, 11 Drawing Sheets

METHOD AND SYSTEM FOR REDUCING I/O NOISE AND POWER

FIELD OF THE INVENTION

The invention relates to I/O devices. In particular it deals with the noise impact caused by converting a low core voltage signal with low current to a higher interface voltage signal with high current (current multiplication effect).

BACKGROUND OF THE INVENTION

Integrated circuits commonly make use of more than one voltage level. Depending on the technology used, the internal, core structures may operate at one of several low voltage levels (VDD), while the external interface or input/output (I/O) is commonly powered by a higher voltage VDDIO. Typically level shifters are used in beginning stages to shift the voltage level of internal signals up to a higher voltage for I/O purposes. For instance the core voltage signal may be at 1.6 to 2.0 V and be converted to a 4.5 to 5.5V for interfacing to a receiver.

The problem is that the amplification of the signal from the lower core voltage level to the higher voltage interface signal level carries with it a substantial increase in the current in the I/O driver due to the larger loading in the interface, which typically causes elevated noise levels due to voltage overshoot and undershoot, VDDIO droop and ground bounce effects caused by the change in the amount of current passing through inductive, resistive and capacitive components in a short period of time.

The present application seeks to provide a new method of reducing such I/O noise while simultaneously reducing I/O power.

SUMMARY OF THE INVENTION

According to the invention there is provided a method of reducing I/O noise, comprising reducing the current flowing in an I/O driver after a non-zero, time delay following a high-to-low or low-to-high signal change. In particular, the current flow in the I/O driver, which includes a PMOS driver transistor and an NMOS driver transistor, may be controlled by controlling the voltage on the gates of the PMOS and NMOS driver transistors.

Typically a pre-driver circuit feeds a signal into the I/O driver, and the voltage on the gates of the PMOS and NMOS driver transistors may be controlled by controlling current flow through the pre-driver circuit. The pre-driver circuit typically includes a NAND gate connected to the PMOS driver transistor, and a NOR gate connected to the NMOS driver transistor. Current flow through the NAND gate may be controlled in order to control the voltage on the gate of the PMOS driver transistor, while current flow through the NOR gate may be controlled in order to control the voltage on the gate of the NMOS driver transistor. The control of the current through the NAND gate may be achieved by providing a first threshold voltage sensitive device to monitor the output of the I/O driver. The first threshold voltage sensitive device may be defined by a first inverter and may control the current through the NAND gate by controlling a first current control transistor connected to the NAND gate. The control of the current from the power supply through the NOR gate may, in turn, be achieved by providing a second threshold voltage sensitive device to monitor the output of the I/O driver. The second threshold voltage sensitive device may be defined by a second inverter and may control the current through the NOR gate by controlling a second current control transistor connected to the NOR gate. Thus, the threshold voltage sensitive devices sense the pad voltage and control the current through the NAND and NOR gates by defining feedback loops from the pad. At least one additional transistor may be provided at each of the NAND and NOR gates to maintain a reduced flow of current though the NAND and NOR gates when the current control transistors are off.

Typically the current control transistor connected to the NAND gate is switched off after a non-zero time delay following a data signal change from low to high. The time delay may correspond to the time it takes for the pad voltage to reach the threshold voltage of the first inverter. Similarly the second current control transistor connected to the NOR gate is typically switched off after a non-zero time delay following a data signal change from high to low. The time delay may correspond to the time it takes for the pad voltage to reach the threshold voltage of the second inverter.

Further, according to the invention, there is provided a reduced noise I/O driver having a driver PMOS transistor with a PMOS gate and a driver NMOS transistor with an NMOS gate, the I/O driver further comprising at least one feedback loop from an output of the driver, operable to control the voltage on at least one of the PMOS gate and NMOS gate after a non-zero time delay.

The driver may further comprise a pre-driver, the at least one feedback loop being operable to control the flow of current through the pre-driver. The pre-driver may include a NAND gate connected to the gate of the PMOS driver transistor, and a NOR gate connected to the gate of the NMOS driver transistor, the at least one feedback loop controlling the flow of current through the NAND gate and the NOR gate. The driver may further comprise a current control transistor connected to the NAND gate to control the flow of current through the NAND gate, and may further comprise a current control transistor connected to the NOR gate to control the flow of current through the NOR gate.

DETAILED DESCRIPTION OF THE INVENTION

Figure 1A:
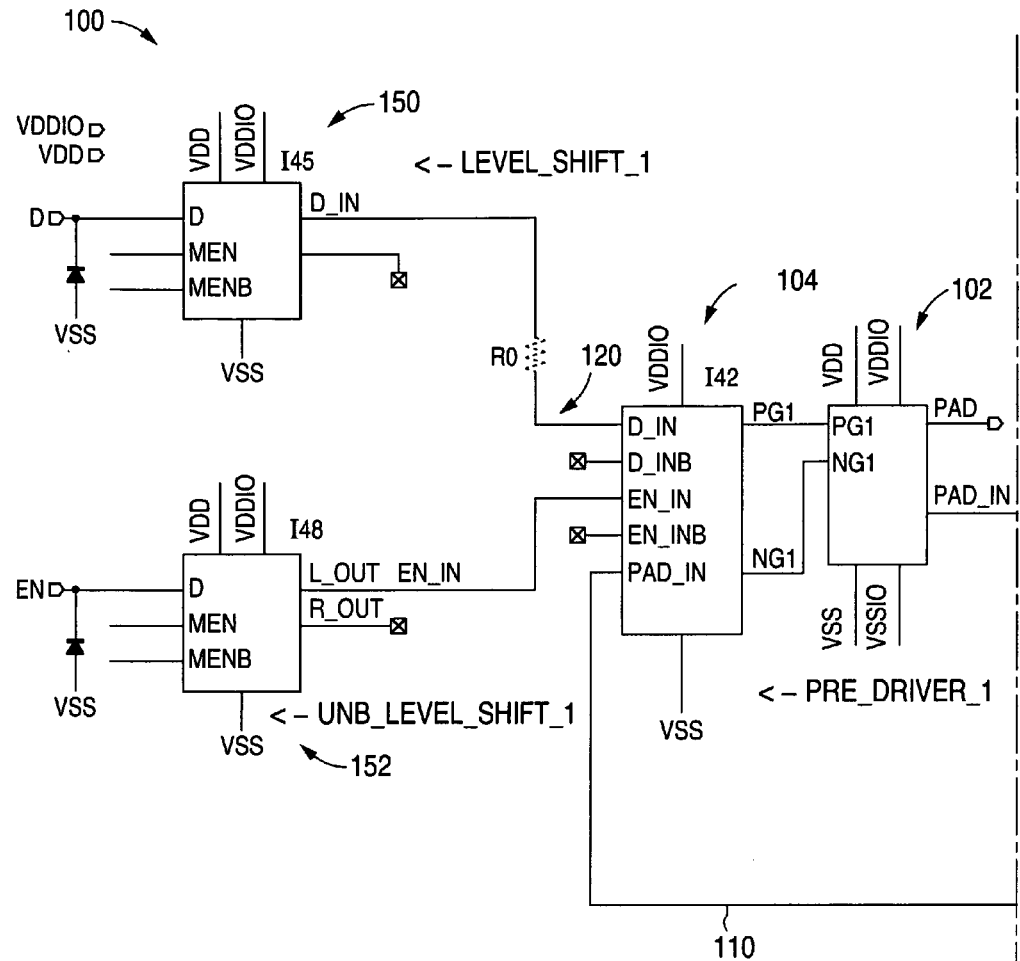
FIG. 1 is a simplified circuit diagram of one embodiment of a circuit of the invention.
Figure 1A:
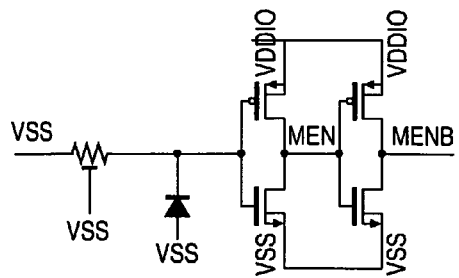
Figure 1A:
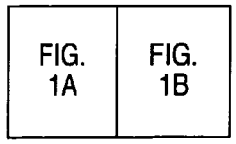
Figure 1B:
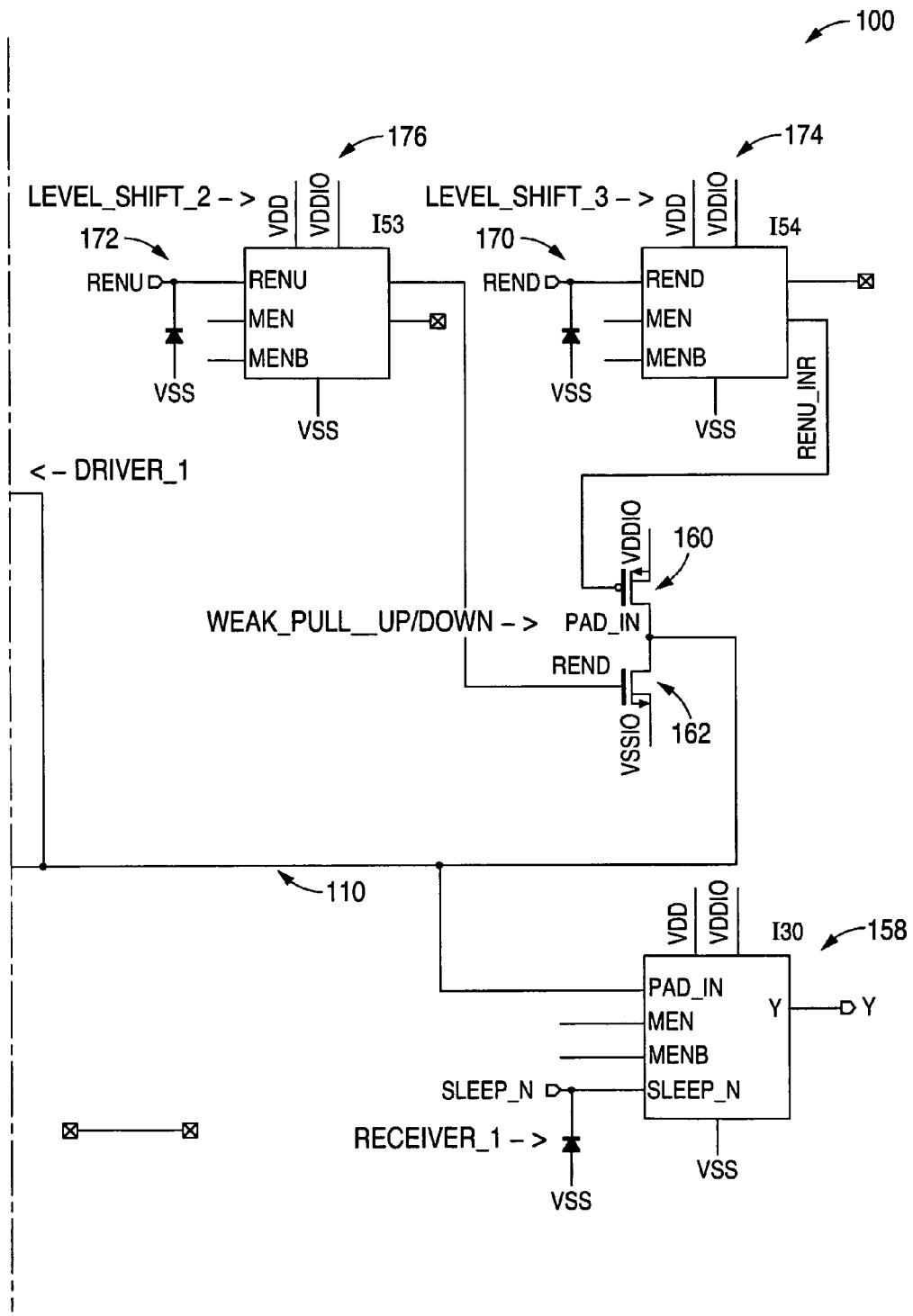

FIG. 1 shows an overview of one embodiment of a low noise level, low power I/O circuit of the invention. The circuit 100 includes an I/O driver 102 and pre-driver 104. In order to reduce the noise and power consumption in the I/O driver 102, the current flow through the driver I/O is selectively reduced in accordance with the invention by controlling the voltage on the driver transistor gates. A typical I/O driver will include one or more stages of PMOS and NMOS driver transistors (as discussed in greater detail with respect to FIG. 2 below). The gates of the PMOS and NMOS driver transistors are connected to the outputs from the pre-driver 104. In particular, the pre-driver includes a NAND gate (shown in FIG. 2) that controls the gate voltage of the PMOS driver transistor of the I/O driver 102, and further includes a NOR gate (shown in FIG. 2) that controls the gate voltage of the NMOS driver transistor.

In this embodiment, in order to control the current through the pre-driver 104 a feedback loop 110 from the output 112 of the I/O driver is fed back to the pre-driver 104. As will be discussed in greater detail with respect to FIG. 2, the output 112 represents a time-delayed version of the input data signal 120 that is fed into the pre-driver 104. Thus the feedback of the output represents a time-delayed control signal that controls the current through the NAND and NOR gates of the pre-driver 104 and thereby controls the gate voltages on the PMOS and NMOS driver transistors of the I/O driver 102.

Figure 2:
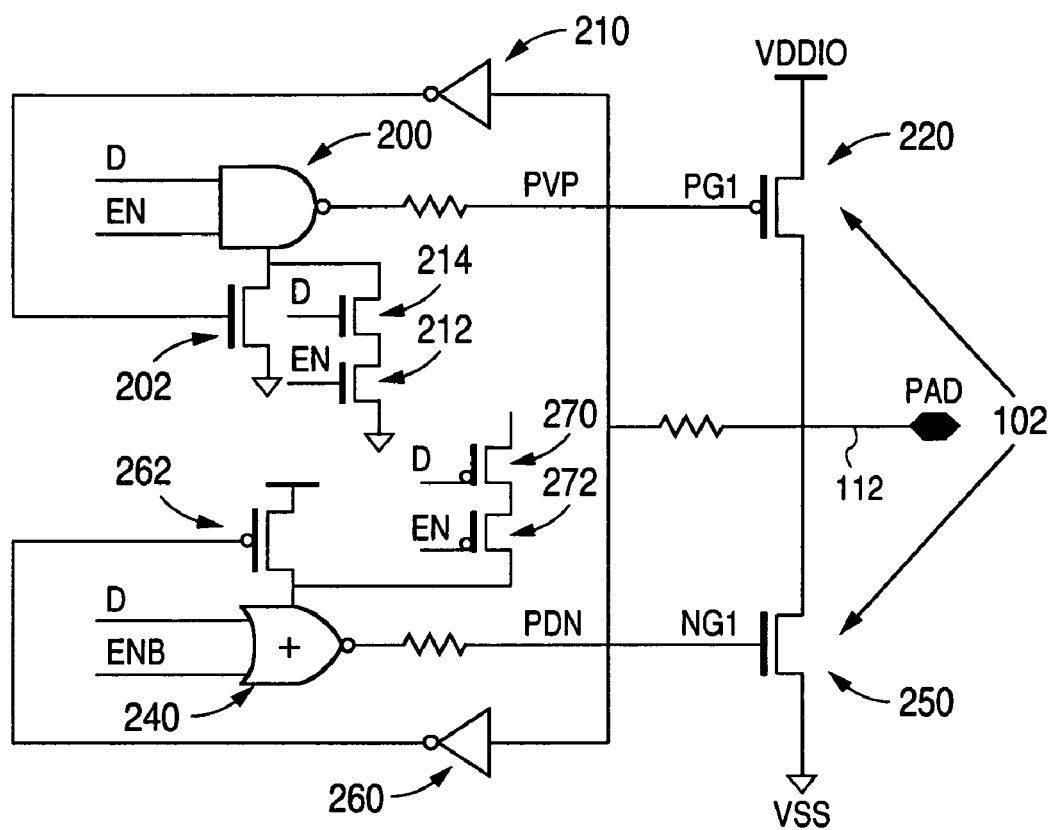
FIG. 2 is a circuit diagram of a pre-driver and I/O driver in accordance with one embodiment of the invention.
Figure 3A:
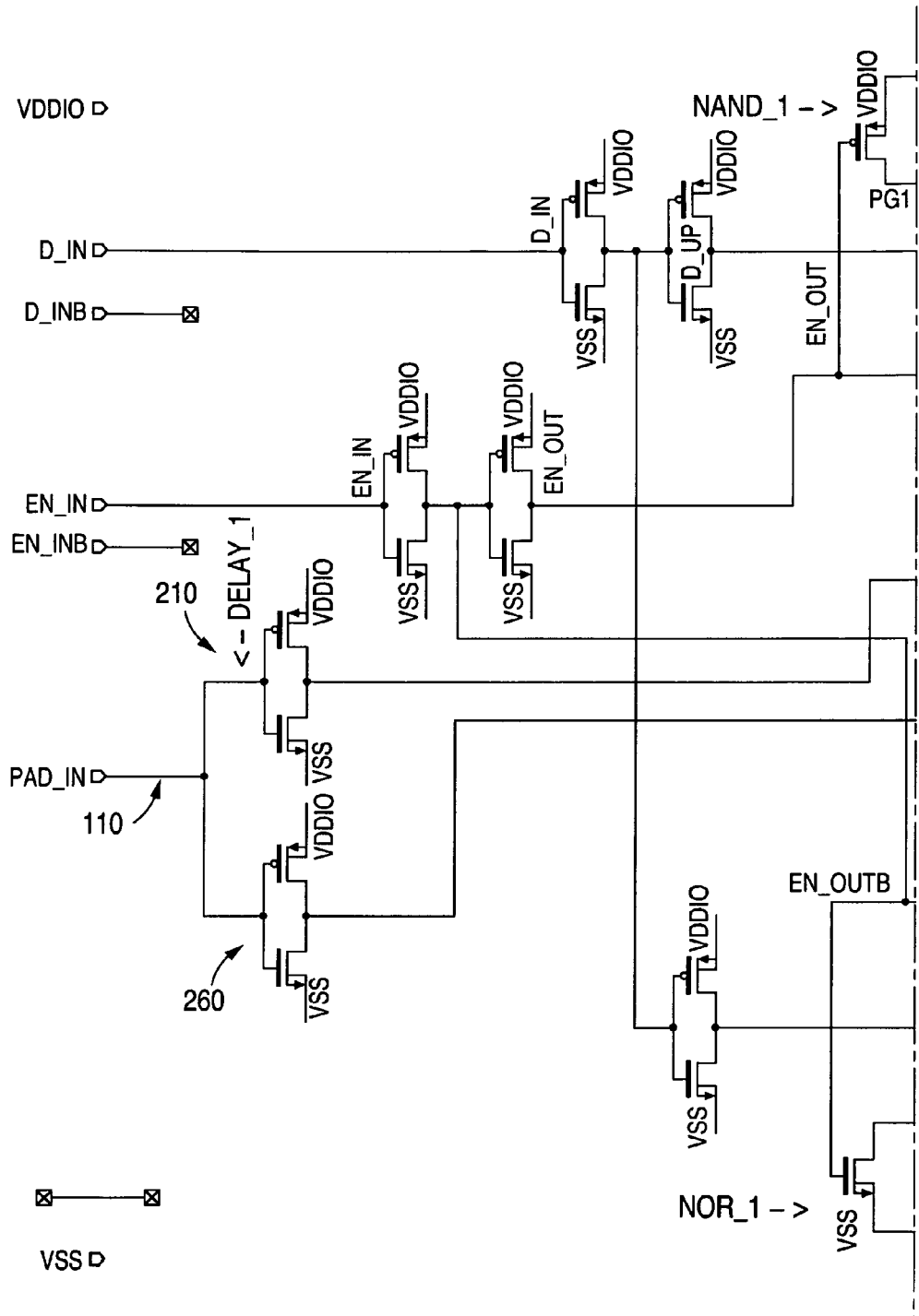
FIG. 3 is a circuit diagram of one embodiment of a pre-driver with feedback structure in accordance with the invention.
Figure 3A:
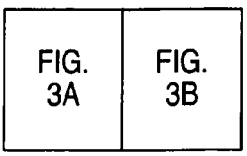
Figure 3B:
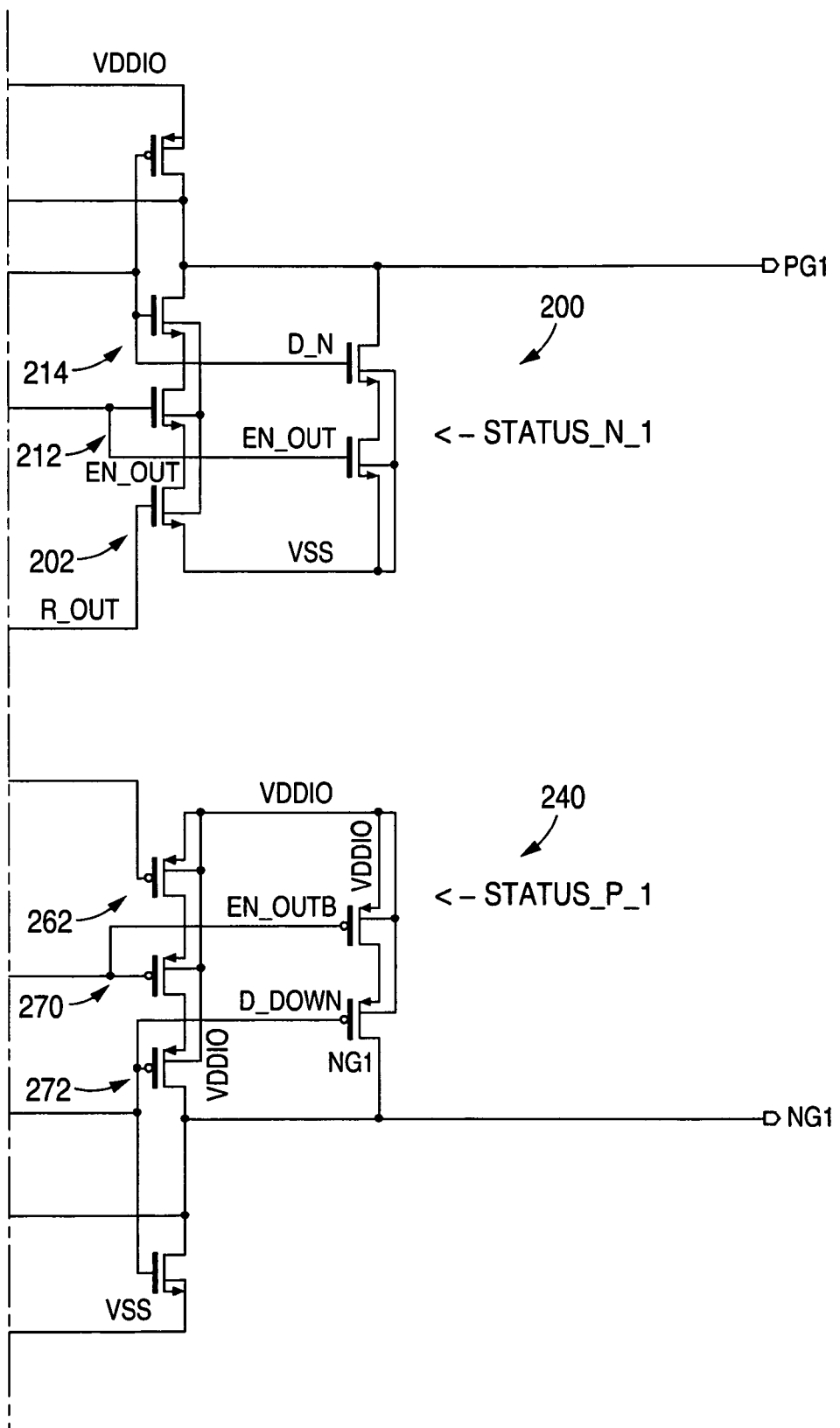

This is best understood by considering the detailed view of the driver 102 and pre-driver 104 shown in FIG. 2. The effect of the feedback is that after a certain time delay following the data signal 120 changing state from low to high the current through the NAND gate 200 is reduced. As is discussed in greater detail below, this is achieved by adding NMOS 202 to the NAND gate 200 and controlling the gate of the NMOS 202 using a threshold voltage sensitive device connected to the pad or output of the I/O driver. In this embodiment, the threshold voltage sensitive device is defined by a first inverter 210.

The effect is that at time t1 the data input to the pre-driver 104 goes from low to high.

At time t2, after a certain time delay the data signal at the output 112, which is fed back to the pre-driver 104 provides a control signal to the pre-driver 104. Thus, when the data signal feedback on line 110 goes high, its inverse (due to the first threshold voltage sensitive inverter 210) starts to turn NMOS 202 off. However NMOS transistors 212 and 214 that have been added to the pre-driver NAND gate 200 remain on allowing a small current path through the NAND gate 200. This allows a low status to be maintained on the gate of the PMOS driver transistor 220.

Figure 5:
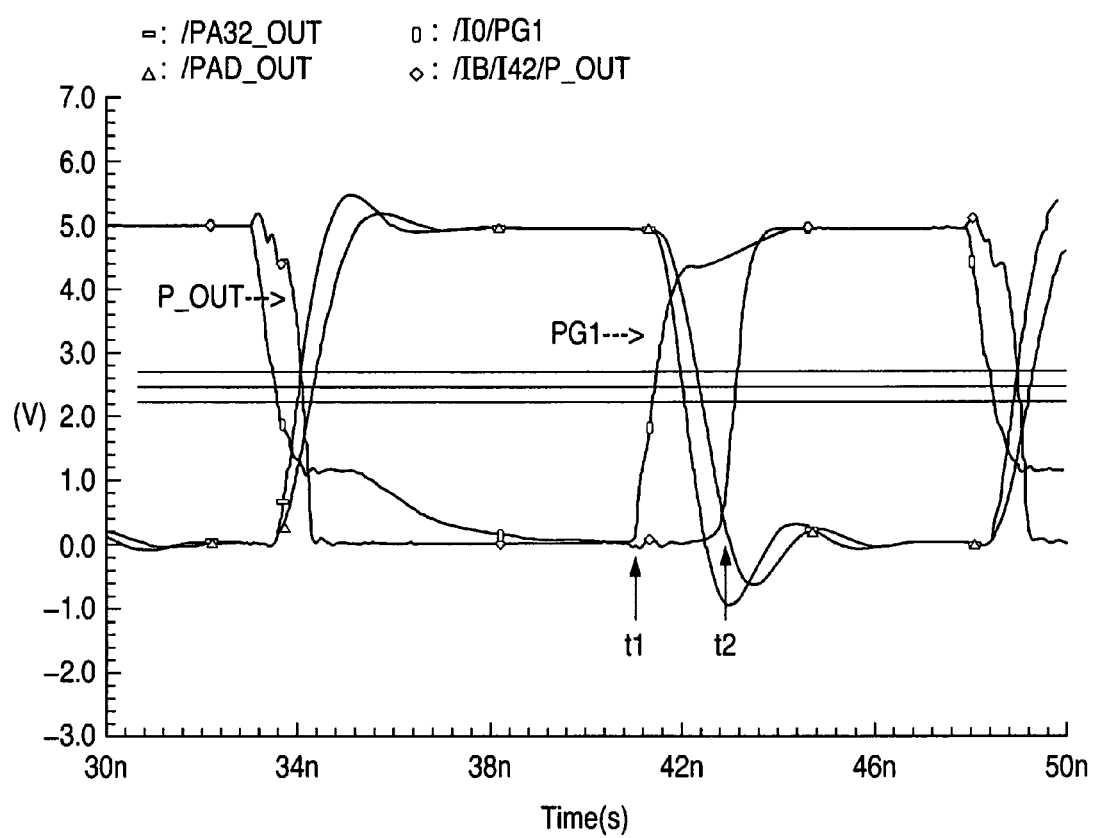

As shown in the V-t curves (pre-driver pull-up waveforms) of FIG. 5, the output 130 (PG1) from the pre-driver NAND gate 200, which controls the gate of the PMOS driver 220 goes low first (since the data signal into the pre-driver 104 has gone from low to high). After a certain time delay the inverted output signal that is fed back to control the NMOS 202 goes low to turn off the major current path in NAND gate 200. As a result the gate voltage of the driver PMOS 220 is lifted a little higher than zero, thereby reducing the noise-producing current change in the driver PMOS 220 and smoothing the effect of the change in switching current in the LRC components.

Similarly, when the data input signal 120 into the NOR gate 240 goes from high to low (at time t3), the output from the NOR gate 240 (NG1) goes from low to high to turn on the NMOS driver transistor 250. After a certain time delay as the voltage at the output 112 is pulled from high to low, the feedback signal, as inverted by the second threshold voltage sensitive inverter 260 starts to turn off the PMOS 262, which is connected to the NOR gate 240. As a result, at time t4 the major pull-down current path is cut off. However, as in the case of the NAND gate, a secondary current path is maintained. In this case PMOS transistors 270, 272 are provided to maintain a small current through the NOR gate to maintain the high status on the gate of the driver NMOS 250.

Figure 6:
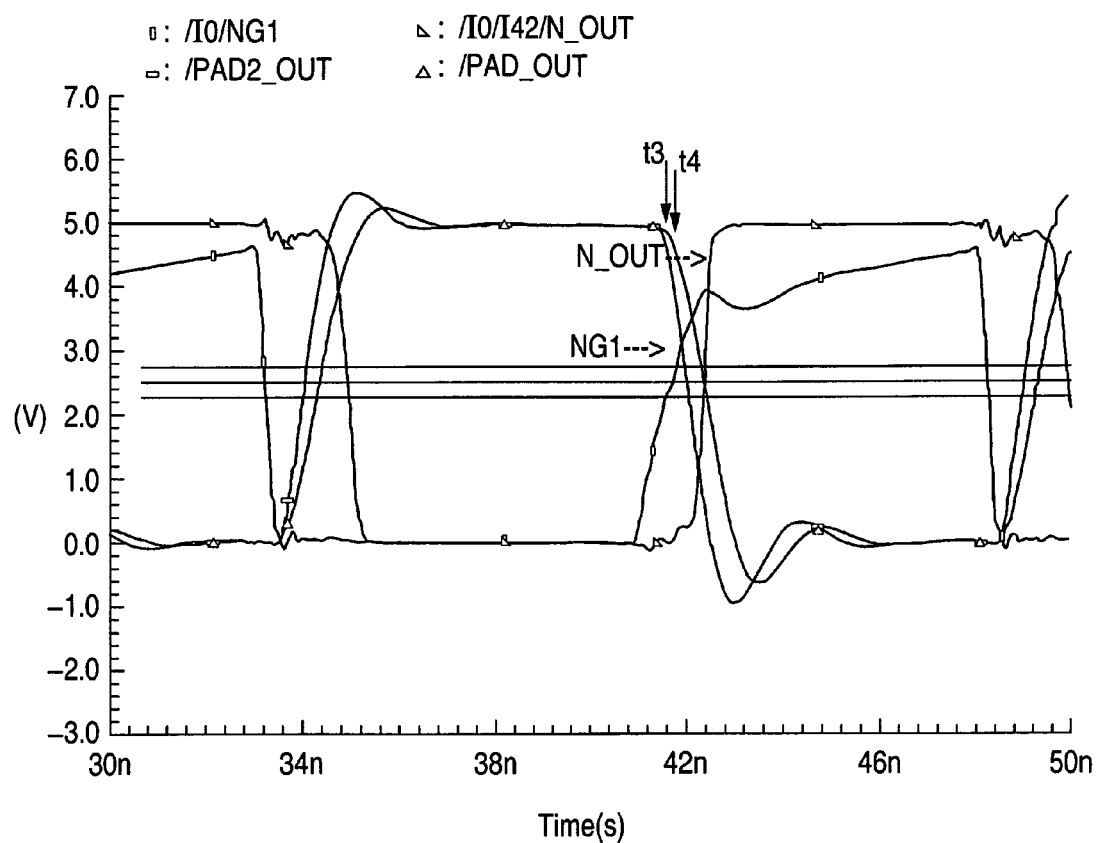

The pre-driver pull-down waveforms are shown in FIG. 6, which show that NOR gate output NG1 is pulled up first at time t3. After a time delay, at time t4 the inverted output signal fed back to PMOS 262 is pulled up to turn off the major current path in NOR gate 240. This causes the NMOS driver 250 gate voltage to be pulled down a little, thereby weakening the current conducted by the driver pull-down NMOS 250.

Thus it will be appreciated that at the beginning of any low to high and every high to low transition of the data signal, the driver pull-up PMOS 220 and driver pull-down NMOS 250, respectively are turned on at their full strength, and after a time delay the gate voltage is increased in the case of the PMOS 220 and decreased in the case of the NMOS 250 to weaken the current conduction of the driver transistors, thereby reducing noise and power in the I/O interface. Nevertheless, in spite of the gate voltage increase in the case of the PMOS 220 and gate voltage decrease in the case of the NMOS 270, they maintain their respective low and high states.

As mentioned above, invertors 210 and 260 are threshold voltage sensitive device and are designed to control the turn off time for device NMOS 202 in NAND 200 and that of the PMOS 262 in NOR 240.

In this way, since the major current paths are cut off through the use of NMOS 202 and PMOS 262, which controls the current in PMOS driver transistor 220 and NMOS driver transistor 250 transistors 210 and 260 will be referred to herein as current control devices.

The non-zero time delays for turning off the major current paths in the pre-driver will depend on the drive strength and pad loading and on the threshold voltages of threshold voltage sensitive inverters in the above design.

In order to better understand the delay circuit, it will now be discussed in greater detail with respect to the pull-up driver PMOS 220. For example, in the case of a 1 pf load on the pad, in order to reach a threshold voltage of 1.5V at rising edge, this I/O may only need 3 ns. On the other hand, if the voltage sensitive inverter's threshold voltage is chosen as 1.8V, this voltage sensitive inverter will flip from high to low at 3 ns+a delta delay, which corresponds to the time needed for the inverter to reach the threshold voltage of 1.8V, so that after 3 ns+delta delay, NMOS 202 will be turned off (The delta delay is the time needed to swing the inverter voltage from 1.5V to 1.8V). The major current path in NAND 200 gate is thus cut off so that the voltage to the gate of PMOS driver transistor 220 is no longer pulled down.

If instead the pad presents a 50 pf load, this IO may need 6 ns to reach the same voltage 1.5V at the rising edge, and if the threshold voltage in the voltage sensitive inverter 210 is designed at 1.8V there will be a 6 ns+delta delay in order to turn off the major current path in NAND(200). Thus the gate of PMOS driver transistor 220 will be held low at least a few ns longer than in the first example. In contrast, if the threshold voltage in the voltage sensitive inverter 210 is designed at 1.2V, the inverter will flip earlier than 3 ns+delta delay. The 3 ns may not change but the delta delay will be shorter than the delta delay for the threshold voltage designed at 1.8V for the inverter 210.

To control the threshold voltage of an inverter means to control the turn on time of the inverter, thereby allowing the turn on time to be controlled so that the gate voltage of PMOS 220 stays low for a shorter or longer period of time depending on the threshold voltage of the inverter 210. Since the gate voltage of PMOS 220 controls the current flowing from power supply to the pad, the feedback loop allows the current through the PMOS 220 to be controlled.

For completeness, FIG. 1 shows the rest of the circuit, which includes a first level shifter 150 that converts the data signal level from VDD to VDDIO. It also includes a second level shifter 152 in the form of an unbalanced level shifter which shifts the enable signal 160 from a VDD to a VDDIO level. The unbalanced level shifter 152 differs from the level shifter 150 in that it powers up in a known state during VDD/VDDIO power up. The output 112 from the I/O driver, apart from providing the feedback in accordance with one embodiment of the invention, also feeds into a receiver 158 and provides a feed-forward loop to a weak pull-up 160 and weak pull-down 162 that are controlled from level-shifted signals 170, 172, respectively that are shifted by level shifters 174, 176.

When the driver is disabled, in order to ensure that the PAD is kept in a certain state, either low or high, the weak pull-up 160, which is implemented here a small PMOS and the weak pull-down 162, which is implemented here as a small NMOS provide a defined output state. When weak pull-up control signal RENU is asserted (high) (but REND (low) is not asserted), the output from weak pull-up level-shifter 174 enables small PMOS 160 to pull the PAD to high, When weak pull-down control signal REND is asserted (high) but RENU is not asserted (low), the output from weak pull-down level-shifter 176 will enable small NMOS 162 to pull the PAD down to ground. Since the pull-up/down devices are smaller and weaker than any driver transistor in the I/O driver, the driver can overwrite the weak pull-up/down state if any one of the driver transistors is enabled at the time that either the weak pull-up or weak pull-down is enabled.

Figure 4A:
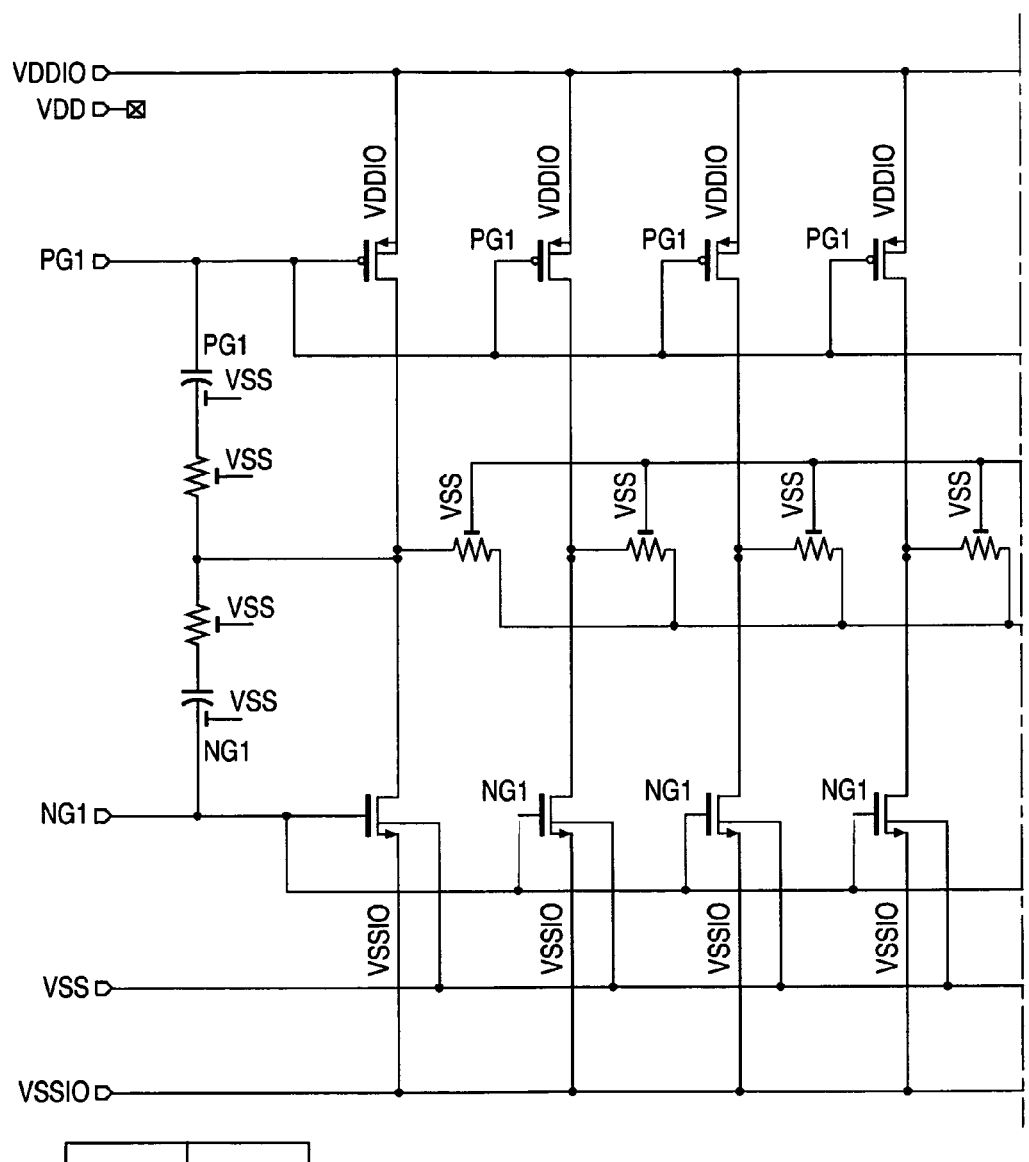
FIG. 4 is a circuit diagram of one embodiment of an I/O driver used in the invention, FIG. 5 are voltage vs. time curves showing pre-driver pull-up waveforms of one embodiment of the invention, FIG. 6 are voltage vs. time curves showing pre-driver pull-down waveforms of one embodiment of the invention.
Figure 4B:
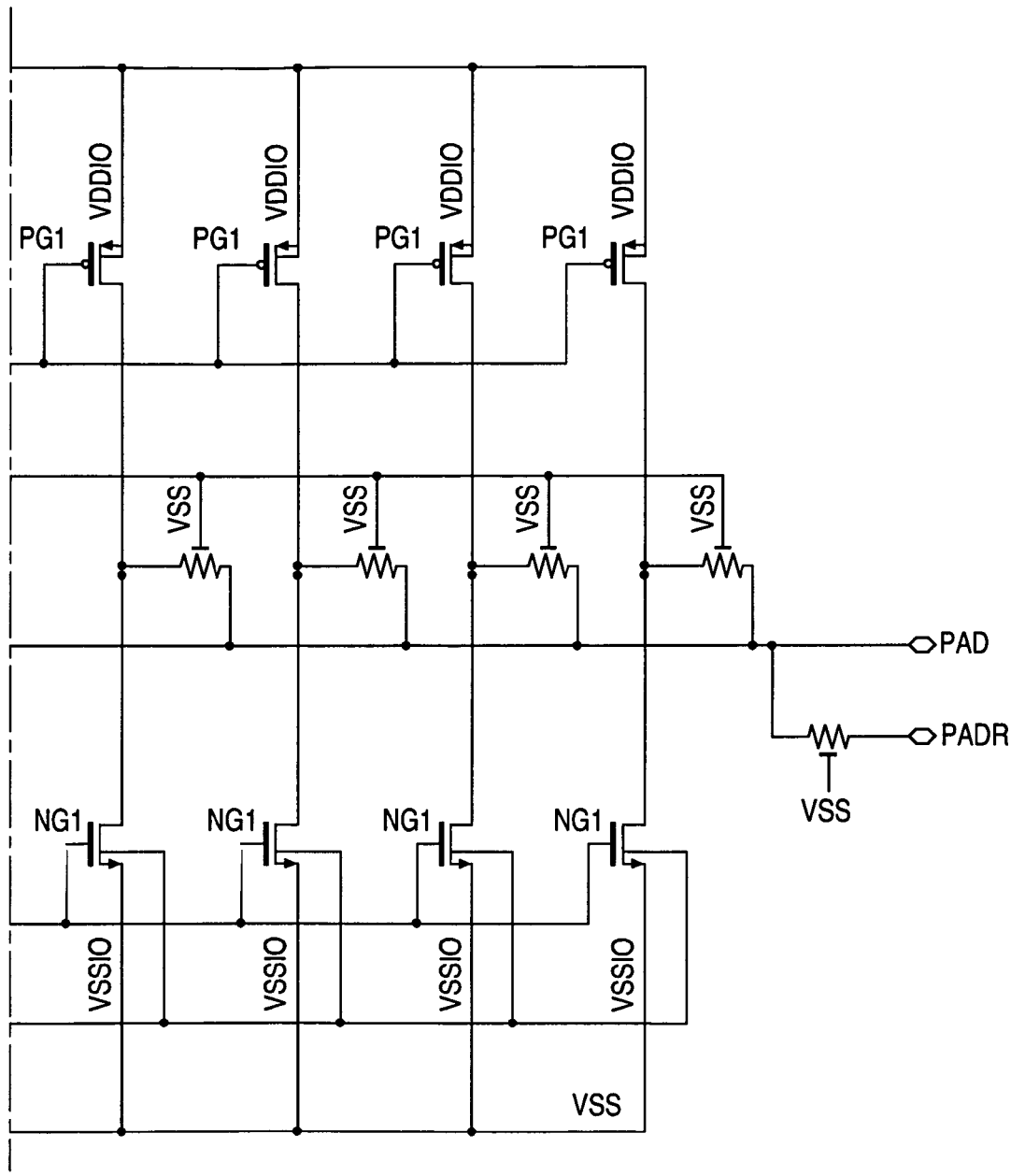

While the present invention was described with respect to a specific embodiments, the invention is not limited to the particular embodiment but can be implemented in different ways without departing from the scope of the claims. For instance, the I/O driver, although depicted in FIG. 2 as comprising a single PMOS and NMOS driver transistor, it will commonly include a bank of PMOS transistors and a bank of NMOS transistors as is shown in FIG. 4.

Figure 7:
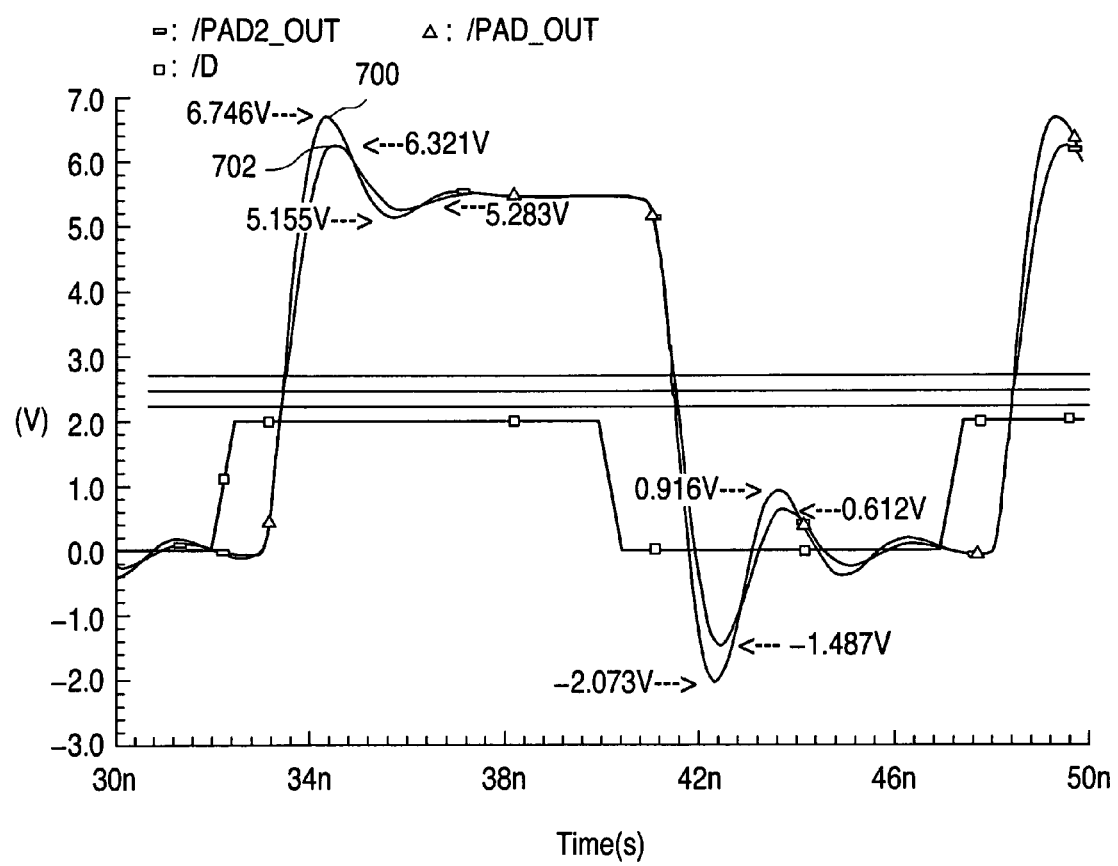
FIGS. 7 and 8 shows voltage vs. time curves illustrating comparative noise reduction in an I/O interface circuit in accordance with the embodiment without and with slew rate control capacitors.

In addition to the variations to the circuit discussed above, different embodiments have shown to have varying results. Thus, for instance the inclusion or exclusion of slew rate capacitors have shown to effect voltage overshoot, voltage undershoot, VDDIO droop and ground bounce effects. In particular, FIG. 7 shows V-t curves for the data output signal voltage from a prior art I/O circuit (curve 700) compared to the data output signal voltage from an I/O driver circuit of the invention in which no slew rate control capacitors were used in the circuit (curve 702). Propagation delay from curve 700 to 702 was found to be [(1.288−1.333)/1.288]×100/[(1.281−1.320)/1.281]×100 defined as a comparison between prior art I/O and an I/O of the invention. In the present case, the propagation delay of data to PAD at rising for a prior art I/O was 1.288 ns, and the delay at falling was 1.281 ns. In comparison, the propagation delay of data to PAD at rising for the new I/O was 1.333 ns and the delay at falling was 1.320 ns. The difference in percentage is thus given by $$TPDR=[(1.288-1.333)/1.288]\times 100=-3.49\%$$

$$TPDF=[(1.281-1.320)/1.281]\times 100=-3.044\%$$

Thus, the propagation delay in the present embodiment was slower by 3.49% during rising
and slower by 3.04% during falling compared to the prior art I/O.

The overshoot changed from 6.746 to 6.321 for a percentage improvement of $\{[(6.746-5.5)-(6.321-5.5)]/(6.746-5.5)\}\times 100$ and a noise reduction of 34.10% since the overshoot in the prior art I/O used for the comparison was found to be 6.746V at a VDDIO level of 5.5V compared to the present embodiment which had an overshoot of only 6.321V. VDDIO droop went from 5.155 to 5.283 for a percentage improvement of $\{[(5.5-5.155)-(5.5-5.283)]/(5.5-5.155)\}\times 100$ for a noise reduction of 37.10%. Undershoot went from −2.073 to −1.487 for a percentage improvement of $[(2.073-1.487)/(2.073)]\times 100$ for a noise reduction of 28.26%. Ground bounce went from 0.916 to 0.612 for a percentage improvement of $[(0.916-0.612)/0.916]\times 100$ and a noise reduction of 33.187%.

Figure 8:
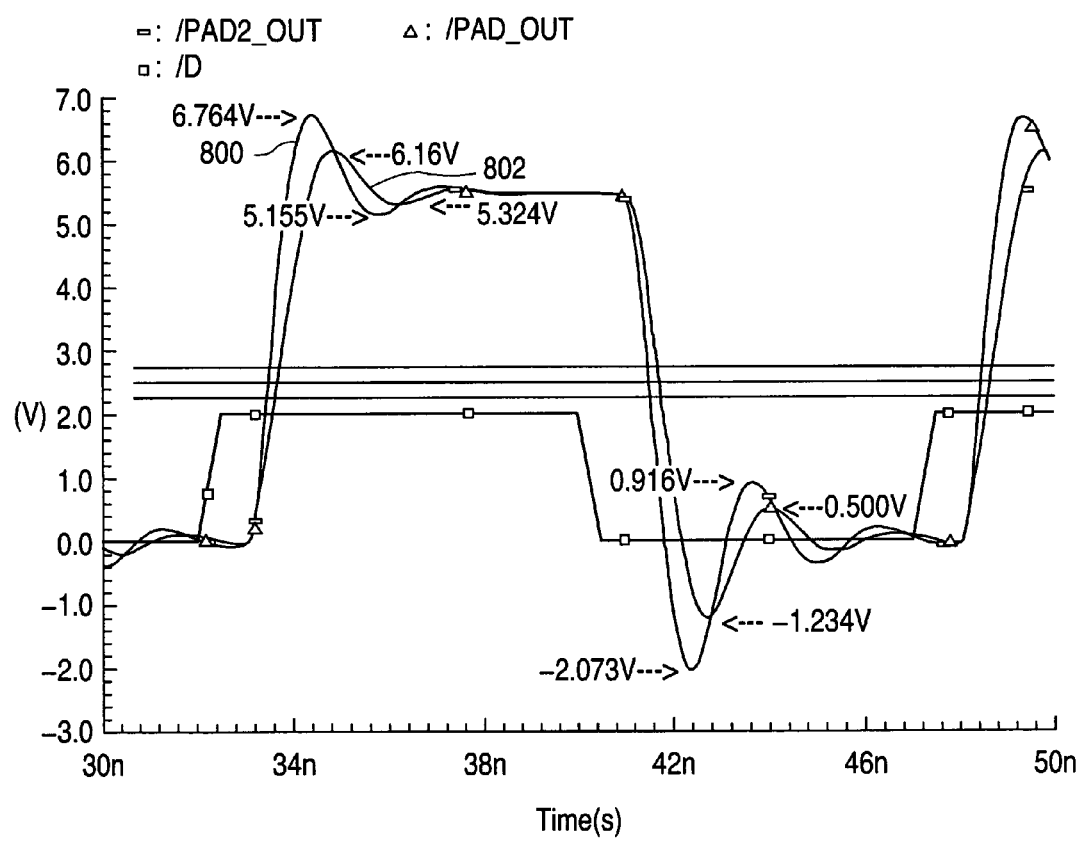

FIG. 8 shows similar V-t curves as FIG. 7 but showing the effect of including slew rate control capacitors 400, 402 between the pre-driver outputs PG1 and NG1, as shown in FIG. 4. Thus FIG. 8 shows the data output signal voltage from a prior art I/O circuit (curve 800) compared to the data output signal voltage from an I/O driver circuit of the invention (curve 802). In this circuit of the invention the overshoot noise reduction was found to be 47.30%, the VDDIO droop noise reduction was found to be 48.99%, the undershoot noise reduction was found to be 40.47% and the ground bounce noise reduction was found to be 45.41% for the circuit of the invention over the prior art circuit. Thus the improvements were even more pronounced when slew rate control capacitors were included in the circuit.

In addition the power reduction achieved in the circuit of the invention with slew rate control capacitors as a percentage due to reduced over-shoot was 34.109%, and due to reduced under-shoot, was 33.187%.

Other embodiments can be designed without departing from the scope of the invention. For instance, the feedback loop 110 shown in FIG. 1 can be seen in FIG. 2 to split into two paths, each including a threshold voltage sensitive inverter and a current control transistor. It will be appreciated that in another embodiment entirely separate feedback loops could be provided or instead that some of the components such as the threshold voltage sensing inverters can be combined to provide one device for both the NAND and the NOR gate of the pre-driver. It will be appreciated that insofar as the threshold voltage sensitive devices for the NAND and NOR gates are the same device or similar devices, the time delay as defined by the threshold voltage of the threshold voltage sensitive device will be the same or substantially the same for the NAND and NOR predriver devices.

What is claimed is:
1. A method of reducing I/O noise, comprising
reducing the current flowing in an I/O driver after a non-zero time delay following a high-to-low or low-to-high signal change, while maintaining at least some current flow through the I/O driver at all times, wherein the I/O driver includes PMOS and NMOS driver transistors the gates of which are fed by a pre-driver in the form of a NAND gate that includes a first PMOS transistor connected in parallel with a second PMOS transistor and having their outputs connected to the gate of the PMOS driver transistor, and a NOR gate that includes a first NMOS transistor connected in parallel with a second NMOS transistor and having their outputs connected to the gate of the NMOS driver transistor, the NAND and NOR gates each being connected between a power rail and ground, the method comprising controlling current flow through the NAND gate from the power rail to ground by connecting the outputs of the first and second PMOS transistors to ground via a first current control transistor, and controlling current flow through the NOR gate from the power rail to ground in order by connect- ing the outputs of the first and second NMOS transistors to the power rail via a second current control transistor.

2. A method of claim 1, wherein the control of the current through the NAND gate is achieved by providing a first threshold voltage sensitive device to monitor the output of the I/O driver and controlling the first current control transistor.

3. A method of claim 2, wherein the first threshold voltage sensitive device is defined by a first inverter.

4. A method of claim 1, wherein the control of the current from the power supply through the NOR gate is achieved by providing a second threshold voltage sensitive device to monitor the output of the I/O driver and controlling the second current control transistor.

5. A method of claim 4, wherein the second threshold voltage sensitive device is defined by a second inverter.

6. A method of claim 1, wherein at least one additional transistor is provided at each of the NAND and NOR gates to maintain a reduced flow of current though the NAND and NOR gates when the current control transistors are off.

7. A method of claim 6, wherein the first current control transistor connected to the NAND gate is switched off after a first non-zero time delay following a data signal change from low to high.

8. A method of claim 7, wherein the first non-zero time delay corresponds to the time it takes for the pad voltage to reach the threshold voltage of the first voltage sensitive device.

9. A method of claim 7, wherein the second current control transistor connected to the NOR gate is switched off after a second non-zero time delay following a data signal change from high to low.

10. A method of claim 9, wherein the second non-zero time delay corresponds to the time it takes for the pad voltage to reach the threshold voltage of the second inverter.

11. A method of claim 9, wherein the first and second non-zero time delays are the substantially the same.

12. A reduced noise I/O driver comprising
a driver PMOS transistor with a PMOS gate or multiple driver PMOS transistors connected to a common PMOS gate and connected to a single common power supply,
a driver NMOS transistor with an NMOS gate or multiple driver NMOS transistors connected to a common NMOS gate and connected to a single common power supply,
at least one feedback loop from an output of the I/O driver, operable to control the voltage on at least one of the PMOS gate and NMOS gate after a non-zero time delay while maintaining at least one of the driver PMOS transistor or driver NMOS transistor on at all times,
a NAND gate defining a NAND output that controls the PMOS gate, and
a NOR gate defining a NOR output that controls the NMOS gate, wherein the NAND output is connected via a first current control transistor to ground, and the NOR output is connected via a second current control transistor to a power rail.

* * * * *